United States Patent
Ho

(10) Patent No.: US 8,227,271 B1
(45) Date of Patent: Jul. 24, 2012

(54) PACKAGING METHOD OF WAFER LEVEL CHIPS

(75) Inventor: Sin-Hua Ho, Tainan (TW)

(73) Assignee: Himax Technologies Limited, Tainan (TW)

( * ) Notice: Subject to any disclaimer, the term of this patent is extended or adjusted under 35 U.S.C. 154(b) by 0 days.

(21) Appl. No.: 13/166,167

(22) Filed: Jun. 22, 2011

Related U.S. Application Data

(60) Provisional application No. 61/436,605, filed on Jan. 27, 2011.

(51) Int. Cl.
*H01L 21/00* (2006.01)
(52) U.S. Cl. ............... 438/26; 438/27; 257/E33.059; 257/E33.061
(58) Field of Classification Search ............ 438/26, 438/27, 127
See application file for complete search history.

(56) References Cited

U.S. PATENT DOCUMENTS

| | | | |
|---|---|---|---|
| 7,083,993 B2 * | 8/2006 | Erchak et al. | 438/25 |
| 7,591,702 B2 * | 9/2009 | Negley | 445/58 |
| 2006/0189098 A1 * | 8/2006 | Edmond | 438/460 |
| 2008/0121911 A1 * | 5/2008 | Andrews et al. | 257/98 |
| 2008/0157333 A1 * | 7/2008 | Lin et al. | 257/687 |
| 2010/0029023 A1 * | 2/2010 | Neff et al. | 438/15 |
| 2010/0038670 A1 * | 2/2010 | Panaccione et al. | 257/98 |
| 2010/0279437 A1 * | 11/2010 | Neff et al. | 438/14 |
| 2011/0114982 A1 * | 5/2011 | Chao | 257/98 |
| 2012/0012873 A1 * | 1/2012 | Lin | 257/98 |

* cited by examiner

Primary Examiner — Alexander Ghyka
(74) Attorney, Agent, or Firm — J.C. Patents

(57) ABSTRACT

A packaging method of wafer level chips including following steps is provided. First, a plurality of chips attached on a first film is provided, and the chips on the first film are disposed respectively corresponding to a plurality of electrode patterns of a substrate. Then, a phosphor layer is respectively formed on at least one surface of each of the chips. Next, a second film is disposed on the phosphor layers, and the second film is opposite to the first film. Further, the first film is removed from the base surface of each of the chips. Then, the base surfaces of the chips are attached to the substrate. Afterward, each of the chips is electrically connected with the corresponding electrode pattern through a wire bonding. Finally, a packaging gel is provided to cover each of the chips, and the packaging gel is solidified.

12 Claims, 7 Drawing Sheets

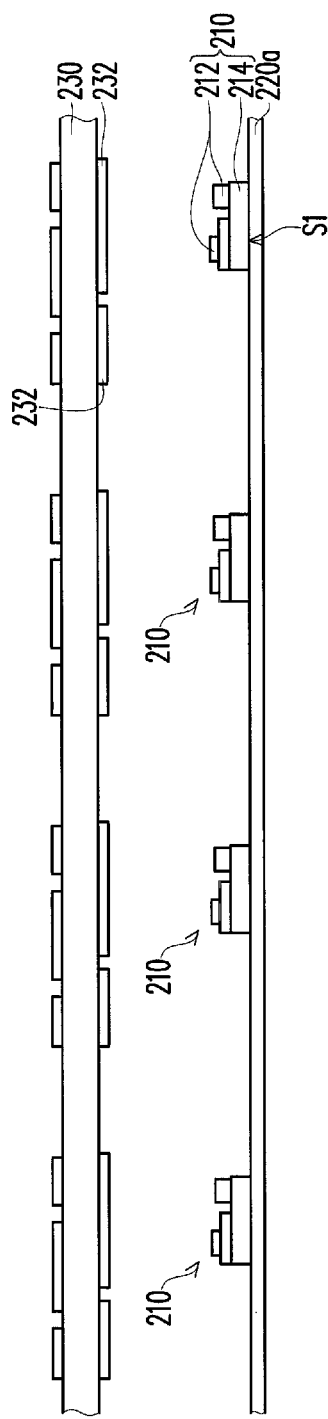
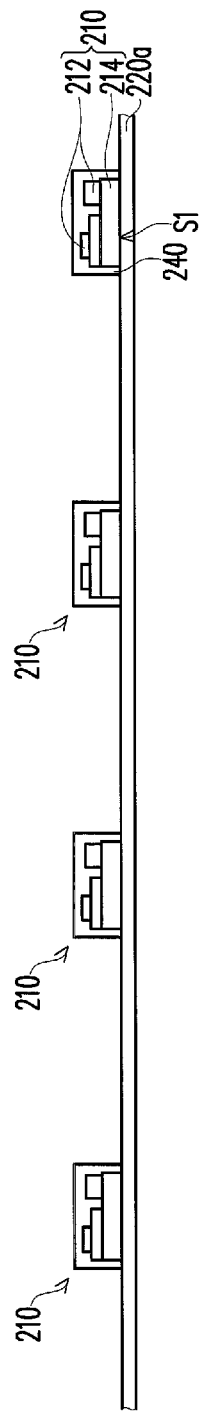

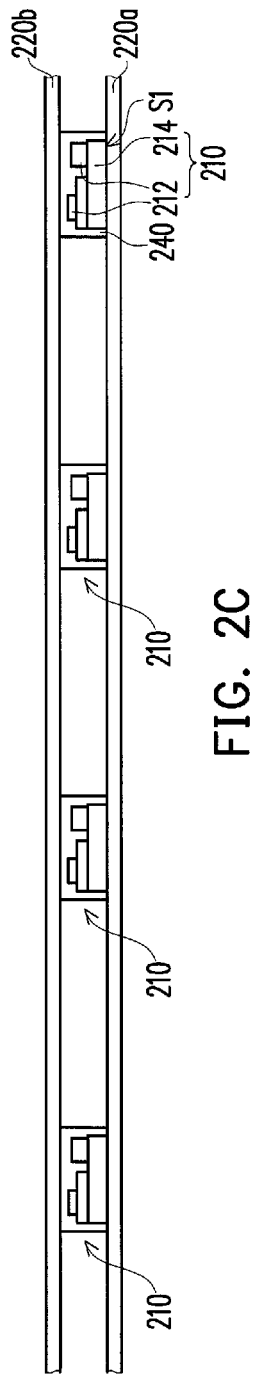
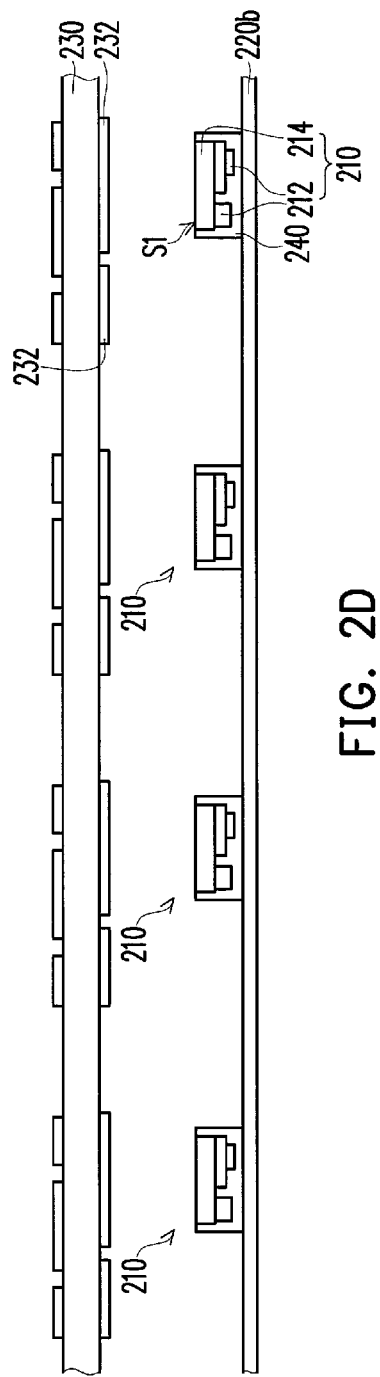

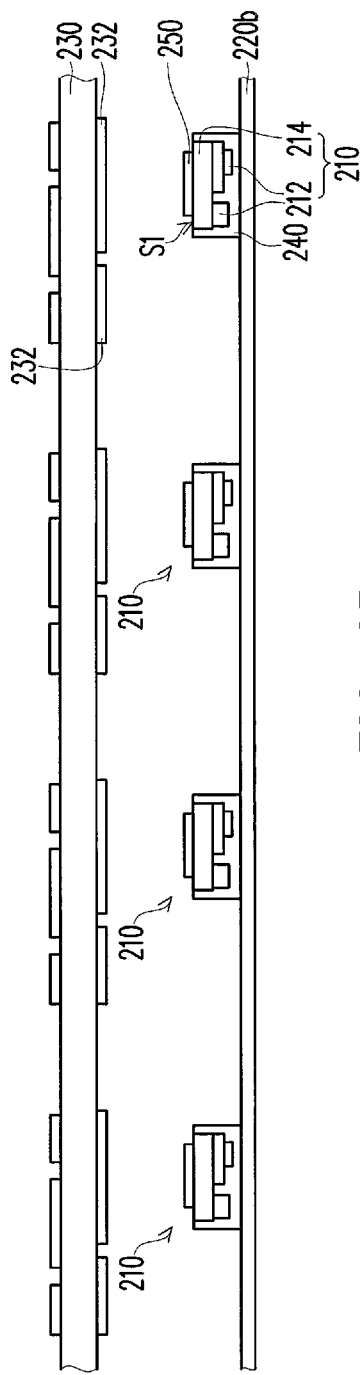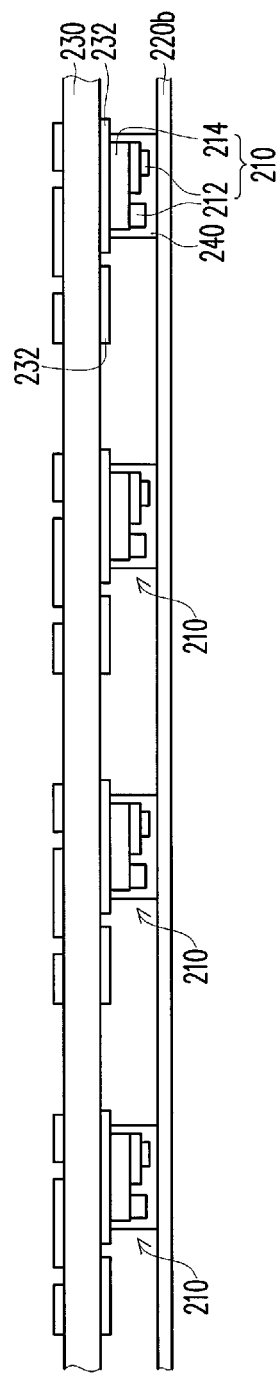

PACKAGING METHOD OF WAFER LEVEL CHIPS

CROSS-REFERENCE TO RELATED APPLICATION

This application claims the priority benefits of U.S. provisional application Ser. No. 61/436,605, filed on Jan. 27, 2011. The entirety of the above-mentioned patent application is hereby incorporated by reference herein and made a part of this specification.

BACKGROUND OF THE INVENTION

1. Field of the Invention

The present invention generally relates to a packaging method. More particularly, the present invention relates to a packaging method of wafer level chips.

2. Description of Related Art

Nowadays, compared to other light source such as incandescence, a light emitting diode (LED) is not only able to significantly reduce power consumption, but also has longer lifetimes, faster response speed, compact size, lower maintenance cost and grater reliability. Accordingly, the LED has become an indispensable element in the modern life, especially in the electronic, communication, and consumer products fields.

FIG. 1A to FIG. 1E are cross-sectional views showing conventional packaging steps of an LED chip. Please refer to FIG. 1A to FIG. 1E. First, as shown in FIG. 1A, a substrate 110 is provided, and the substrate 110 has a plurality of electrodes 112a and 112b on which a plurality of LED dies to be respectively disposed so as to form a plurality of LED chips. Then, as shown in FIG. 1B, one LED die 120 of the LED dies to be disposed is first bonded on the electrode 112b of the substrate 110. After that, as shown in FIG. 1C, the LED die 120 on the electrode 112b is electrically connected to the electrode 112a through a wire bonding. For example, the LED die 120 on the electrode 112b is electrically connected to the electrode 112a through a bonding wire 130. Then, referring to FIG. 1D, a fluorescent layer 140 is forming on the LED die 120. Finally, a packaging gel 150 is provided to cover the LED die 120 and corresponding electrodes 112a and 112b, and thus one LED chip 100 of the LED chips is fabricated. However, during the conventional packaging steps depicted from FIG. 1A to FIG. 1E, merely one LED chip 100 can be manufactured by each run. Thus, to fabricate one thousand LED chips 100, each of the packaging steps needs to be performed one thousand times, and therefore the conventional packaging process of the LED chips is a rather time consuming and tedious process and it is not quite cost effective.

SUMMARY OF THE INVENTION

Accordingly, the present invention is directed to a packaging method of wafer level chips which is capable of reducing packaging time and manufacturing cost, and thus improves manufacturing efficiency.

As embodied and broadly described herein, the present invention provides a packaging method of wafer level chips. The packaging method of wafer level chips includes following steps. First, a plurality of chips attached on a first film is provided. Herein, the chips on the first film are disposed respectively corresponding to a plurality of electrode patterns of a substrate, and a base surface of each of the chips is contacted with the first film. Next, a phosphor layer is respectively formed on at least one surface of each of the chips. Then, a second film is disposed on the phosphor layers, and the second film is opposite to the first film. Further, the first film is removed from the base surface of each of the chips. Next, the base surfaces of the chips are attached to the substrate. Afterward, each of the chips is electrically connected with the corresponding electrode pattern through a wire bonding. Finally, a packaging gel is provided to cover each of the chips, and the packaging gel is solidified.

According to an embodiment of the present invention, the packaging method of wafer level chips further includes removing the second film before electrically connecting each of the chips with the corresponding electrode pattern by the wire bonding.

According to an embodiment of the present invention, the attaching step includes disposing an attaching material on the base surfaces to make that the base surfaces being attached to the substrate through the attaching material.

According to an embodiment of the present invention, the attaching step further includes a reflow process to reflow the attaching material between the base surfaces and the substrate.

According to an embodiment of the present invention, the phosphor layer is formed through a coating process which comprises a spin-coating method, a printing technique, a scraper method, a screen printing method, a spraying method, an electrophoresis deposit method, a evaporation method or a sputter process.

According to an embodiment of the present invention, the attaching step further includes baking the attaching material between the base surfaces and the substrate.

According to an embodiment of the present invention, the attaching material is a solder paste, a silver glue or a eutectoid material.

According to an embodiment of the present invention, each of the chips includes a bump and a die, and the bump is disposed between the phosphor layer and the die.

According to an embodiment of the present invention, the bump of each of the chips is electrically connected with the corresponding electrode through the wire bonding.

According to an embodiment of the present invention, the first film and the second film are blue tapes.

According to an embodiment of the present invention, the substrate is a silicon substrate, a ceramic substrate or a substrate formed by a resin injection method.

According to an embodiment of the present invention, the chip is a light emitting diode chip.

According to the above descriptions, since a plurality of chips respectively disposed corresponding to a plurality of electrode patterns of the substrate are processed in each one step, the packaging method of the wafer level chips is capable of reducing packaging time and manufacturing cost, and thus improves manufacturing efficiency.

In order to make the above features and advantages of the present invention comprehensible, embodiments are described in detail below with the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2H are cross-sectional views showing packaging steps of the wafer level chips according to an embodiment of the present invention.

DESCRIPTION OF THE EMBODIMENTS

Figure 1A:
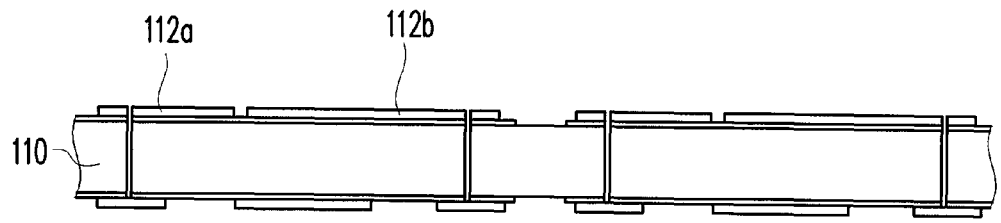
FIG. 1A to FIG. 1E are cross-sectional views showing conventional packaging steps of an LED chip.
Figure 1B:
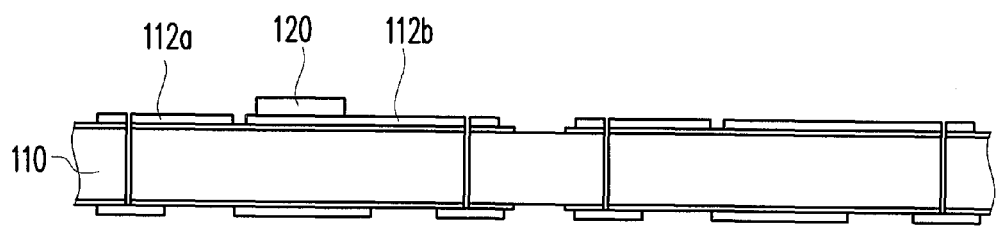
Figure 1C:
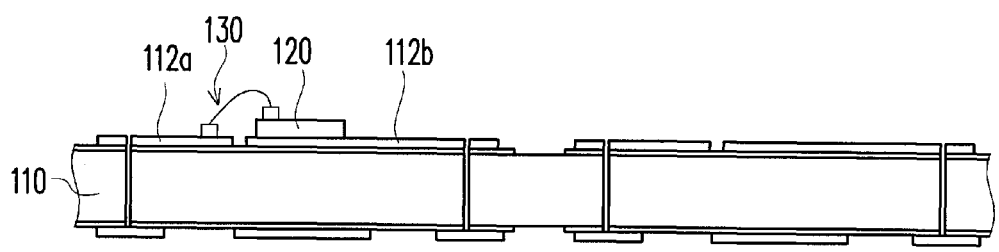
Figure 1D:
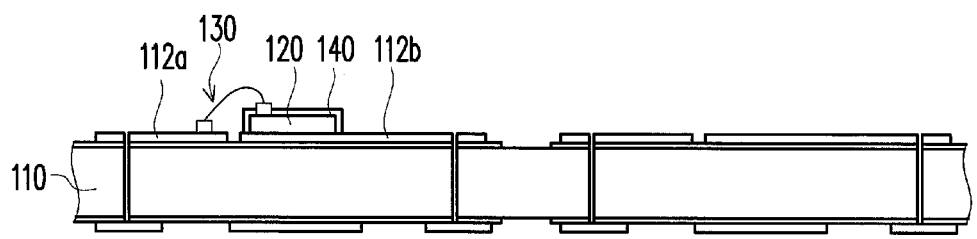
Figure 1E:
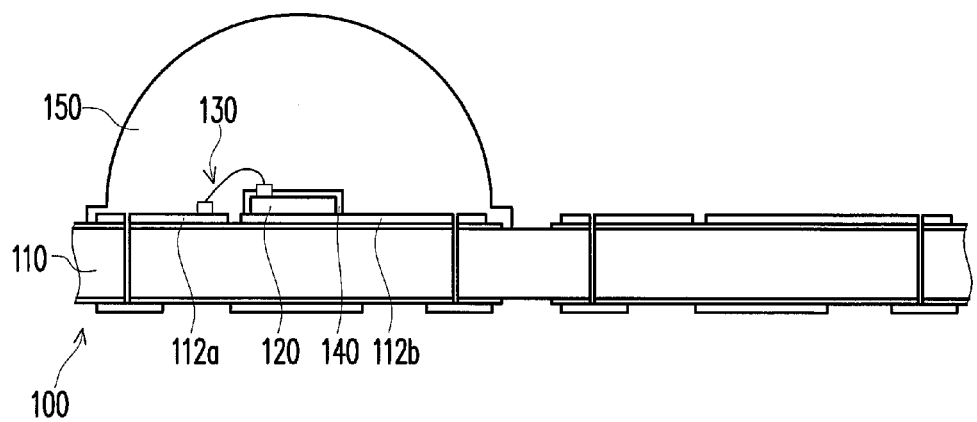

Reference will now be made in detail to the present preferred embodiments of the invention, examples of which are illustrated in the accompanying drawings. Wherever possible, the same reference numbers are used in the drawings and the description to refer to the same or like parts.

The figures are not drawn to scale and they are provided merely to illustrate the present invention. Several aspects of the invention are described below with reference to example applications for illustration. It should be understood that numerous specific details, relationships and methods are set forth to provide a full understanding of the invention. The present invention may be embodied in many different forms and should not be construed as limited to the embodiments set forth herein. For example, the present invention can be embodied as a method or a system.

Figure 2G:
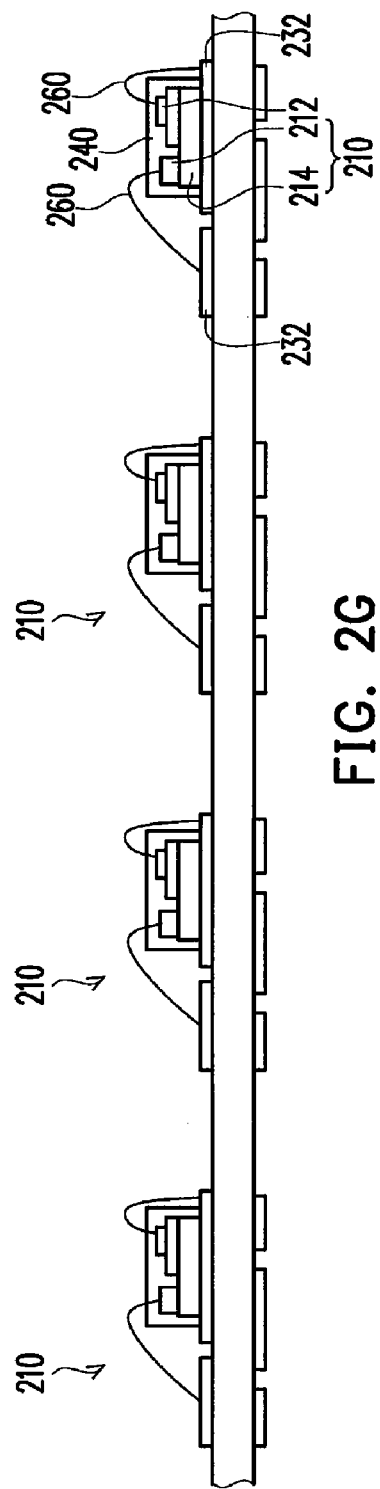

FIG. 2A to FIG. 2H are cross-sectional views showing packaging steps of wafer level chips according to an embodiment of the present invention. FIG. 3 is a flow chart illustrating the packaging steps depicted in FIG. 2A to FIG. 2H. Please refer to FIG. 2A to FIG. 2H and FIG. 3. First, as shown in FIG. 2A, a plurality of chips 210 attached on a first film 220a is provided, wherein the chips 210 on the first film 220a are disposed respectively corresponding to a plurality of electrode patterns 232 of a substrate 230, and a base surface S1 of each of the chips 210 are contacted with the first film 220a (step S110). Further, as shown in FIG. 2A, each of the chips 210 includes at least one bump 212 (two are schematically shown) and a die 214 which is a light emitting diode (LED) die, for example. Herein, the substrate 230 is a silicon substrate, a ceramic substrate or a substrate formed by a resin injection method, while the invention is not limited thereto. Moreover, the first film 220a of the embodiment is, for example, a blue tape. In the embodiment, the chips 210 are wafer level chips. Furthermore, the chips 210 on the first film 220a are, for example, LED chips, and have been classified based on their individual optical and electrical property (e.g. the emission wavelength, voltage, or radiant flux).

Then, as shown in FIG. 2B, a phosphor layer 240 is formed on at least one surface of each of the chips 210 (step S120). In detail, the phosphor layer 240 may be formed on the surfaces of each of the chips 210 expect the base surfaces 51 thereof through a coating process, and the coating process of the embodiment may be a spin-coating method, a printing technique, a scraper method, a screen printing method, a spraying method, an electrophoresis deposit method, a evaporation method or a sputter process. In the embodiment, the bumps 212 are disposed between the phosphor layer 240 and the die 214. Moreover, the bumps 212 are, for example, gold (Au) balls or aluminum (Al) balls for chip package, while the invention is not limited thereto.

After step S120, as shown in FIG. 2C, a second film 220b is disposed on the phosphor layers 240, and the second film 220b is opposite to the first film 220a (step S130). Herein, the second film 220b is above the first film 220a, and the second film 220b is, for example, a blue tape. Then, as shown in FIG. 2D, the first film 220a is removed from the base surface S1 of each of the chips 210 (step S140). Specifically, from FIG. 2C to FIG. 2D, the structure of the chips 210 between the first film 220a and the second film 220b originally in FIG. 2C may be flipped first, so that the first film 220a is above the second film 220b and between the substrate 230 and the chips 210. Further, the position of each of the chips may be slightly adjusted according to the positions of the electrode patterns 232. Then, the first film 220a of FIG. 2C is removed from the base surface S1 of each of the chips 210 to form the structure shown in FIG. 2D from FIG. 2C.

After step S140, as shown in FIG. 2F, the base surfaces S1 of the chips 210 original in FIG. 2C are attached to the substrate 230 (step S150). Specifically, as shown in FIG. 2E, the attaching step (i.e. step S150) may include disposing an attaching material 250 on the base surfaces S1 to make that the base surfaces S1 being attached to the substrate 230 through the attaching material 250. In the embodiment, the attaching step may be performed under high temperature (e.g. from 150 degrees Celsius to 280 degrees Celsius), so that the chips 210 can be firmly attached to the substrate 230. For example, the attaching material 250 of the embodiment may be a solder paste, a silver glue, or a eutectoid reaction and the attaching step may further include reflow process to reflow the attaching material 250 between the base surfaces S1 and the substrate 230. The attaching material 250 is between the base surfaces S1 and the substrate 230. Alternatively, the attaching material 250 may be a silver paste, and the attaching step may further include baking the attaching material 250 between the base surfaces S1 and the carriage 230. Moreover, in another embodiment, the attaching material 230 may be a eutectic material, and the attaching step may further include heating the eutectic material.

Referring to FIG. 2G, after the chips 210 are attached to the electrode patterns 232 of the substrate 230, each of the chips 210 is electrically connected with the corresponding electrode pattern 232 through a wire bonding (step S160). For example, each of the chips 210 is electrically connected with the corresponding electrode pattern 232 through a bonding wire 260. Specifically, the structure originally shown in FIG. 2F may be flipped so that the chips 210 are above the substrate 230, and the second film 220b original in FIG. 2F is removed. Then, as shown in FIG. 2G, the bumps 212 is electrically connected with the electrode pattern 232 through the bumps 212 and the bonding wire 260, and the bonding wire 260 is, for example, a gold line, an aluminum steel, or a metal wire.

Figure 2H:
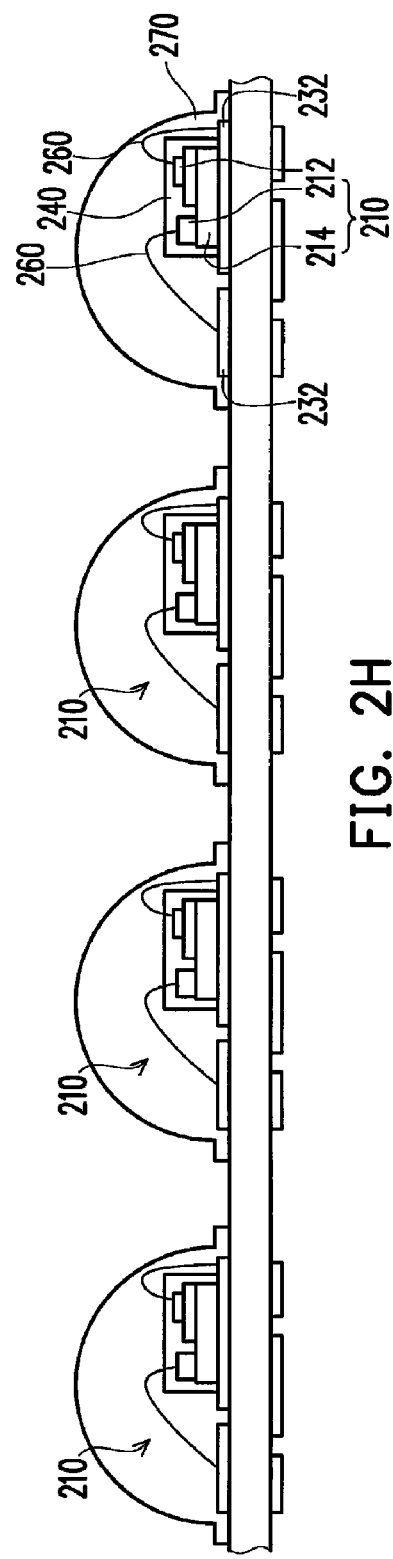
Figure 3:
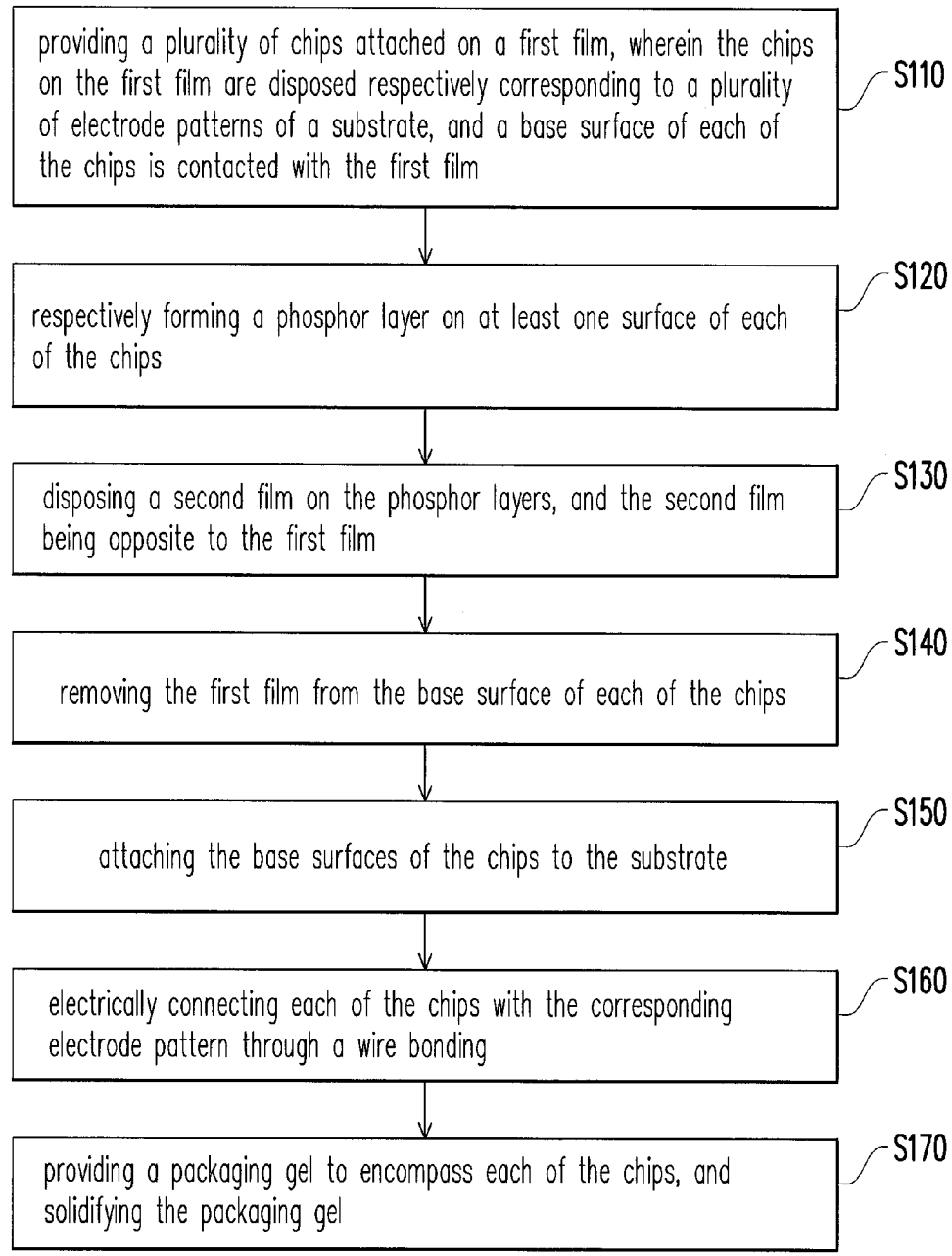
FIG. 3 is a flow chart illustrating the packaging steps depicted in FIG. 2A to FIG. 2H.

Finally, as shown in FIG. 2H, a packaging gel 270 is provided to encompass the chips 210, and the packaging gel is, solidified (step S170). Herein, the package gel 270 encompasses the chips 210, the bonding wire 260 and the electrode patterns 232. In this way, the packaging process of the wafer level chips (i.e. the chips 210) is completed. It should be noted that, since a plurality of chips 210 are processed during each step (i.e. step S110 to step S170), a great number of chips 210 can be packaged by each run of the packaging process as described above. Thus, the packaging method of the embodiment is much faster than the conventional packaging method when a plurality of wafer level chips requires to be packaging. Thus, the newly provided packaging method of the wafer level chips significantly and effectively reduces the packaging time and manufacturing cost and thus improves manufacturing efficiency.

Based on the above, through the packaging method of the embodiment of the invention, a plurality of chips respectively disposed corresponding to a plurality of electrode patterns are processed in each one step, and thus the packaging method is much faster than the conventional package method in which merely one die can be process during each step. Therefore, the newly provided packaging method significantly and effectively reduces the packing time and manufacturing cost and facilities for packaging on a massive scale.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A packaging method of wafer level chips, comprising:
providing a plurality of chips attached on a first film, wherein the chips on the first film are disposed respectively corresponding to a plurality of electrode patterns of a substrate, and a base surface of each of the chips is contacted with the first film;
respectively forming a phosphor layer on at least one surface of each of the chips;
disposing a second film on the phosphor layers, and the second film being opposite to the first film;
removing the first film from the base surface of each of the chips;
attaching the base surfaces of the chips to the substrate;
electrically connecting each of the chips with the corresponding electrode pattern through a wire bonding; and
providing a packaging gel to encompass each of the chips, and solidifying the packaging gel.

2. The packaging method of the wafer level chips according to claim 1, further comprising removing the second film before electrically connecting each of the chips with the corresponding electrode pattern by the wire bonding.

3. The packaging method of the wafer level chips according to claim 1, wherein the attaching step comprises disposing an attaching material on the base surfaces to make that the base surfaces being attached to the substrate through the attaching material.

4. The packaging method of the wafer level chips according to claim 3, wherein the attaching step further comprises a reflow process to reflow the attaching material between the base surfaces and the substrate.

5. The packaging method of the wafer level chips according to claim 1, wherein the phosphor layer is formed through a coating process which comprises a spin-coating method, a printing technique, a scraper method, a screen printing method, a spraying method, an electrophoresis deposit method, a evaporation method or a sputter process.

6. The packaging method of the wafer level chips according to claim 3, wherein the attaching step further comprises baking the attaching material between the base surfaces and the substrate.

7. The packaging method of the wafer level chips according to claim 3, wherein the attaching material is a solder paste, a silver glue or a eutectoid material.

8. The packaging method of the wafer level chips according to claim 1, wherein each of the chips comprises a bump and a die, and the bump is disposed between the phosphor layer and the die.

9. The packaging method of the wafer level chips according to claim 7, wherein the bump of each of the chips is electrically connected with the corresponding electrode through the wire bonding.

10. The packaging method of the wafer level chips according to claim 1, wherein the first film and the second film are blue tapes.

11. The packaging method of the wafer level chips according to claim 1, wherein the substrate is a silicon substrate, a ceramic substrate or a substrate formed by a resin injection method.

12. The packaging method of the wafer level chips according to claim 1, wherein the chip is a light emitting diode chip.

* * * * *